United States Patent
Dubois

(10) Patent No.: US 8,259,455 B2
(45) Date of Patent: Sep. 4, 2012

(54) DEVICE FOR PROTECTING THE PINS OF AN ELECTRONIC COMPONENT

(75) Inventor: Eric Dubois, Montvendre (FR)

(73) Assignee: Ingenico France, Neuilly sur Seine (FR)

( * ) Notice: Subject to any disclaimer, the term of this patent is extended or adjusted under 35 U.S.C. 154(b) by 252 days.

(21) Appl. No.: 12/742,959

(22) PCT Filed: Nov. 14, 2008

(86) PCT No.: PCT/FR2008/052052
§ 371 (c)(1),
(2), (4) Date: Jul. 8, 2010

(87) PCT Pub. No.: WO2009/068827
PCT Pub. Date: Jun. 4, 2009

(65) Prior Publication Data
US 2010/0271789 A1    Oct. 28, 2010

(30) Foreign Application Priority Data
Nov. 15, 2007  (FR) .................................... 07 59052

(51) Int. Cl.
*H05K 1/00* (2006.01)

(52) U.S. Cl. ........ 361/749; 361/789; 174/525; 174/254; 29/829

(58) Field of Classification Search ............... 174/250, 174/254, 255, 260, 261, 262, 525; 361/748–751, 361/789; 29/829–835
See application file for complete search history.

(56) References Cited

U.S. PATENT DOCUMENTS

| 4,972,336 | A  | * | 11/1990 | Reid et al. ................. 360/128 |
| 5,276,572 | A  |   | 1/1994  | Kinoshita et al. |
| 6,575,411 | B1 | * | 6/2003  | Serizawa et al. ............ 248/49 |
| 2002/0154454 | A1 | * | 10/2002 | Kupinski et al. ........... 360/323 |
| 2005/0232095 | A1 |   | 10/2005 | Okamoto et al. |
| 2007/0000126 | A1 | * | 1/2007  | Na ............................ 29/829 |
| 2008/0315989 | A1 | * | 12/2008 | Mirkazemi-Moud et al. .............. 340/5.66 |
| 2009/0302109 | A1 | * | 12/2009 | Kerner et al. ............... 235/439 |

FOREIGN PATENT DOCUMENTS

| DE | 34 05 804  | 8/1985 |
| JP | 10-190156  | 7/1998 |

OTHER PUBLICATIONS

PCT International Search Report received in PCT/FR2008/052052 dated May 28, 2009.
English language translation of PCT International Search Report received in PCT/FR2008/052052 dated May 28, 2009.

* cited by examiner

*Primary Examiner* — Hoa C Nguyen
(74) *Attorney, Agent, or Firm* — Vedder Price, PC

(57) ABSTRACT

The invention relates to a protective device for an electronic component including at least one pin to be electrically connected to an electronic system. The device includes at least one flexible printed circuit including first and second opposite surfaces, a central portion including a through opening for receiving the pin, and flaps connected to the central portion. The printed circuit is made of two insulation layers and includes at least one first conducting track between the two insulating layers, connecting the pin to the electronic system, a second conducting track extending on the first surface, and a third conducting track extending on the second surface. The flaps are folded back at least partially onto each other in order to encapsulate the pin and to electrically connect the second and third conducting tracks.

10 Claims, 3 Drawing Sheets

DEVICE FOR PROTECTING THE PINS OF AN ELECTRONIC COMPONENT

BACKGROUND OF THE INVENTION

1. Field of the Invention

The present invention relates to a device for protecting the pins of an electronic component, for example, a magnetic read head.

2. Discussion of the Related Art

A check reader or a magnetic card reader generally comprises a magnetic read head connected to a printed circuit, which is generally called the reader motherboard. The magnetic read head is comprised of a rigid body containing the internal components of the head and access terminals. The access terminals correspond to metal pins which project from the body of the read head and enable transmission of the signals measured by the read head. The connections between pins of the read head and the motherboard may be wire connections.

Generally, the motherboard and the read head are arranged in a package in which protection devices are provided for detecting an unauthorized access to the motherboard. An example of a protection device corresponds to a flexible membrane at least partly covering the motherboard and in which a lattice-shaped conductive track is provided. The ends of the conductive track are connected to a protection circuit provided at the motherboard level. An attempt of access to the motherboard generally causes an interruption in the conductive track of the membrane. This is detected by the protection circuit and results, for example, in the stopping of the reader operation.

However, especially due to the position of the read head with respect to the motherboard in the reader package, it is generally not possible to protect the read head by means of conventional motherboard protection devices. An individual could then have access to the pins of the read head and collect the signals transmitted on these pins without for such an operation to be detected by the conventional protection devices of the reader.

To protect the pins of the read head, it is necessary to provide a dedicated protection device. A possibility is to partly encapsulate the read head in a rigid cap having an associated protection device, for example, of lattice membrane type. However, there exist many different types of readers, and thus many different arrangements of the read head and of the motherboard in the reader package. The cap shape must then be adapted case by case according to the positions of the read head and of the motherboard in the package. The cost of a protection device with a cap is thus high.

SUMMARY OF THE INVENTION

The present invention aims at a device for protecting the pins of an electronic component, for example a magnetic read head, to be connected to an electronic system, for example, a printed circuit, which authorizes some freedom on positioning of the electronic component with respect to the electronic system and which is likely to be formed at a low cost.

Thus, the present invention provides a device for protecting an electronic component comprising at least one pin to be electrically connected to an electronic system. The device comprises at least one flexible printed circuit comprising first and second opposite surfaces, a central portion comprising a through opening into which the pin is to be inserted, and flaps connected to the central portion. The flexible printed circuit is at least partly formed of the stack of two insulating layers and comprises at least a first conductive track between the two insulating layers, for electrically connecting the pin to the electronic system, a second conductive track extending on the first surface, and a third conductive track extending on the second surface. The flaps are capable of being at least partly folded back on one another to encapsulate the pin and electrically connect the second and third conductive tracks, whereby the second and third conductive tracks form a protection track to be electrically connected to the electronic system.

According to an embodiment, the device comprises a spacer capable of being arranged between the central portion and the flaps.

According to an embodiment, the spacer comprises an additional opening into which the pin is to be inserted.

According to an embodiment, the spacer comprises a threaded opening, the device comprising a screw having a threaded rod capable of cooperating with the threaded opening and a head capable of applying said flaps against the spacer.

According to an embodiment, the second and third conductive tracks are made of carbon.

According to an embodiment, the third conductive track comprises a widened conductive portion at the level of a first flap from among said flaps, the widened conductive portion being capable of being glued to the first surface of a second flap from among said flaps.

According to an embodiment, the second conductive track comprises a first conductive land at the level of a first flap from among said flaps and the third conductive track comprises a second conductive land at the level of a second flap from among said flaps, the first and second flaps being capable of being folded back against each other to put the first conductive land in electric contact with the second conductive land.

The present invention also provides a method for protecting an electronic component comprising at least one pin to be electrically connected to an electronic system. The method comprises the steps of providing a protection device comprising at least one flexible printed circuit comprising first and second opposite surfaces, a central portion comprising a through opening, and flaps connected to the central portion, the flexible printed circuit being at least partly formed of the stack of two layers and comprising at least a first conductive track between the two layers, a second conductive track extending on the first surface, and a third conductive track extending on the second surface, of inserting the pin into the opening, of connecting the first conductive track to the pin, and of at least partly folding back the flaps against one another to encapsulate the pin and electrically connect the second and third conductive tracks, whereby the second and third conductive tracks form a protection track to be electrically connected to the electronic system.

According to an embodiment, the method further comprises the steps of arranging a spacer against the central portion and of at least partly folding back the flaps against the spacer.

According to an embodiment, the third conductive track comprises a widened conductive portion at the level of a first flap from among said flaps. The method further comprises the step of gluing the widened conductive portion to the first surface of a second flap from among said flaps.

The foregoing and other objects, features, and advantages of the present invention will be discussed in detail in the following non-limiting description of specific embodiments in connection with the accompanying drawings.

DETAILED DESCRIPTION

Figure 1:
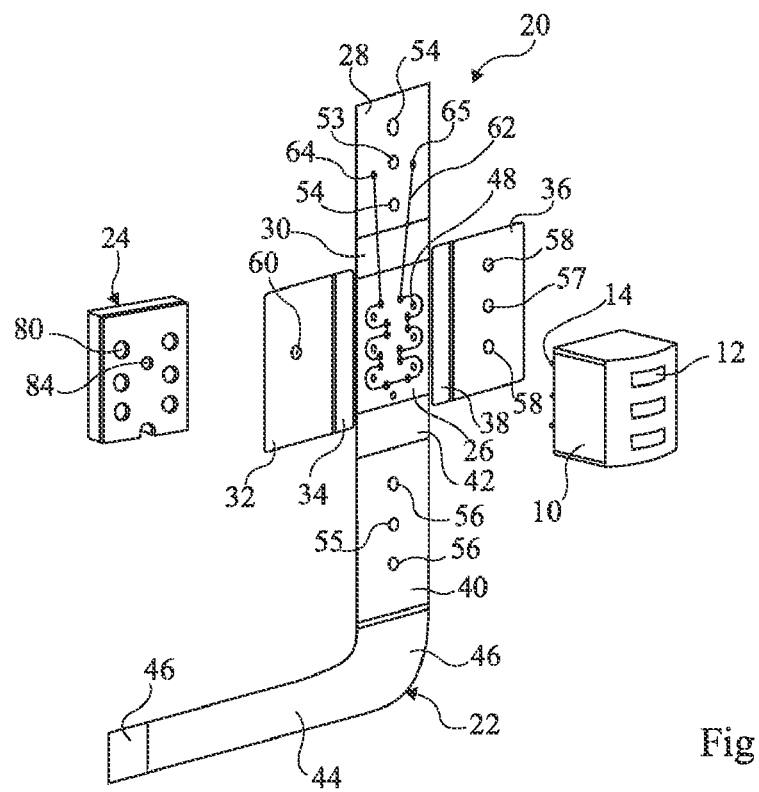
FIGS. 1 and 2 are exploded front and back perspective views of the elements of an embodiment of a magnetic read head protection device.

For clarity, the same elements have been designated with the same reference numerals in the different drawings.

An embodiment of a protection device will now be described for the protection of the pins of a magnetic read head connected to a motherboard of a reader, especially a check or magnetic card reader. However, the present invention may apply to the protection of the pins of any electronic component which must be connected to an electronic system while allowing, to a certain extent, a relative displacement between the electronic component and the electronic system.

The concept of the present invention is to connect the magnetic read head to the motherboard of the reader via a flexible printed circuit which, in addition to electrically connecting the read head pins to connection pads of the motherboard, protects the read head pins against an unauthorized access. This then provides the advantage of the low manufacturing cost of a flexible printed circuit. Further, the flexible printed circuit can at least partly deform. A same flexible printed circuit can thus be used while the magnetic read head and the motherboard are at different relative positions.

Figure 2:
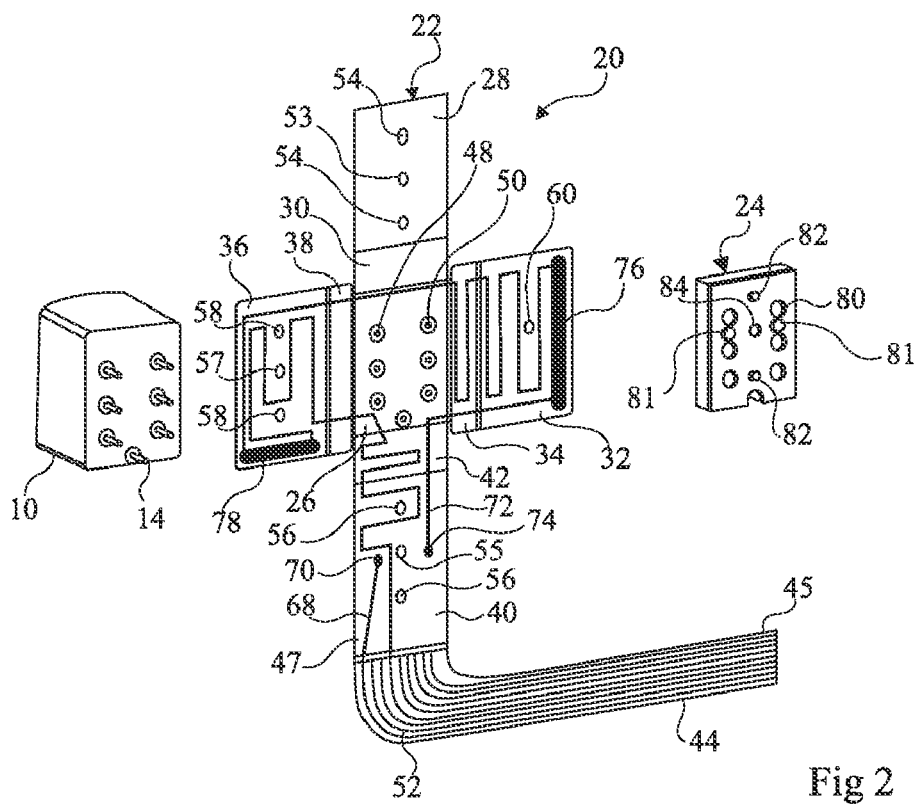

FIGS. 1 and 2 are exploded front and back perspective views of a magnetic read head 10 and of the elements of an embodiment of a protection device 20. Read head 10 comprises, in the present example, three slots 12 at its front surface and pins 14 at its rear surface. Each pin 14 for example corresponds to a metal rod which is a few millimeters high. Protection device 20 comprises a flexible printed circuit 22 and a spacer 24. As an example, flexible printed circuit 22 is formed of a flexible membrane with a thickness on the order of 0.1 mm, for example, made of kapton (Dupont de Nemours trade mark), on a surface of which are distributed conductive tracks, called internal conductive tracks in the following description, for example, made of copper. The flexible printed circuit is covered with an insulating varnish on the side of the internal conductive tracks. Other conductive tracks, called external conductive tracks in the following description, for example made of a carbon or of silver ink, are distributed on the varnish layer and on the membrane surface opposite to the internal conductive tracks.

In the present example, flexible printed circuit 22 comprises a substantially rectangular central portion 26. An upper flap 28 is connected to the upper edge of central portion 26 by a first connector portion 30. A first lateral flap 32 is connected to a lateral edge of central portion 26 by a connector portion 34. A second lateral flap 36 is connected to the opposite lateral edge of central portion 26 by a connector portion 38 and a lower flap 40 is connected to the lower edge of central portion 26 by a connector portion 42. Lower flap 40 extends in a connection portion 44 comprising at its end a connection area 45 to be connected to the reader motherboard. As an example, each flap 28, 32, 36, 40, and each connection portion 30, 34, 38, 42 is substantially rectangular. Call front surface 46 of flexible printed circuit 22 the surface visible in FIG. 1 and rear surface 47 of flexible printed circuit 22 the surface visible in FIG. 2. As an example, the insulating varnish layer covering the membrane forming flexible printed circuit 22 is arranged on the side of rear surface 47 so that the external conductive tracks provided on the side of rear surface 47 can be connected to internal conductive tracks by simple openings provided in the varnish layer.

Central portion 26 is crossed by seven circular openings 48 distributed similarly to pins 14 of read head 10. Conductive rings 50 surround each opening 48 on rear surface 47 of central portion 26. Each conductive ring 50 is connected to one of the internal conductive tracks of flexible printed circuit 22 which connects conductive ring 50 to connection area 45, the internal conductive tracks being shown only at the level of connection portion 44 and of connection portion 45.

Upper flap 28 is crossed by a central opening 53 and two openings 54 distributed on either side of central opening 53. Lower flap 40 is crossed by a central opening 55 and two openings 56 distributed on either side of central opening 55. Lateral flap 36 is crossed by a central opening 57 and two openings 58 distributed on either side of central opening 57. Lateral flap 32 is crossed by a central opening 60.

Internal conductive tracks, for example, made of copper, and external conductive tracks (which may also be called lands or widened portions hereafter), for example made of carbon or silver ink, are dedicated to the protection of the pins of read head 10. More specifically, as shown in FIG. 1, flexible printed circuit 22 comprises, at front surface 46, an external conductive track 62 which snakes around openings 48 of central portion 26 and which connects two external conductive lands 64, 65, provided at the level of upper flap 28. As shown in FIG. 2, at rear surface 47, circuit 22 comprises an internal conductive track 68 which is connected to an external conductive land 70 provided at the level of lower flap 40 and which extends all the way to connection area 45. At rear surface 47, circuit 22 further comprises an internal conductive track 72 which is connected to an external conductive land 74 provided at the level of lower flap 40 and which extends all the way to connection area 45. Internal conductive track 72 snakes at the level of lateral flaps 32 and 36, of central portion 26, of connector portions 34, 38, 42, and of lower flap 40. Two external widened conductive tracks 76, 78 are provided on the path of conductive track 72 to which they are connected, a first external widened conductive track 76 at the level of lateral flap 32 and a second external widened conductive track 78 at the level of lateral flap 36. The arrangement of internal conductive tracks 68, 72 and of external conductive track 62 in FIGS. 1 and 2 is disclosed as an example only and may be different from what is shown.

Spacer 24 has a general parallelepipedal shape, with its largest surface having substantially the same dimensions as central portion 26. Spacer 24 is crossed by seven openings 80 substantially distributed in the same way as pins 14 of read head 10. It also comprises, on one surface, two protrusions 81 and two outward-projecting pads 82. Finally, it comprises an opening 84, which may be threaded.

FIGS. 3A to 3F are rear perspective views illustrating successive steps of an example of a method for assembling protection device 20 on read head 10. In the drawings, only external conductive lands 64, 65, 70, 74, and external widened conductive portions 76, 78 have been shown.

Figure 3A:
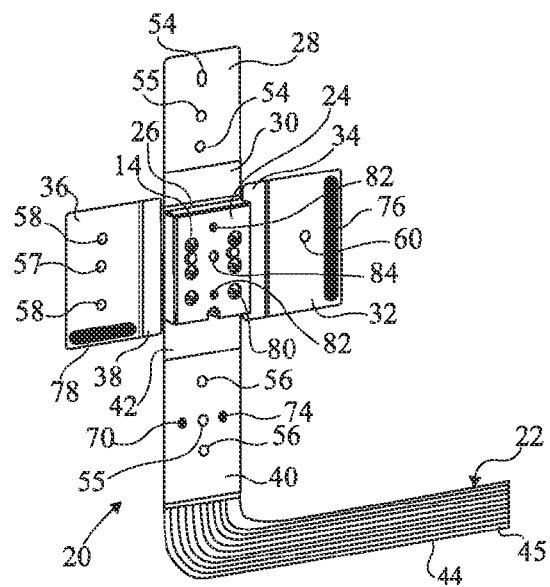
FIGS. 3A to 3F illustrate successive steps of an example of a method for assembling the protection device of FIGS. 1 and 2 to a magnetic read head.

FIG. 3A shows protection device 20 after having carried out the steps of: gluing read head 10 on front surface 46 of central portion 26 of flexible printed circuit 22 while inserting pins 14 of read head 10 into openings 48 of central portion 26; welding pins 14 to conductive rings 50 on the side of rear surface 47 of flexible printed circuit 22; and arranging spacer 24 against central portion 26 on the side of rear surface 47 of flexible printed circuit 22 by insertion of pins 14 into openings 80 of spacer 24, with pads 82 being arranged on the side opposite to central portion 26. Preferably, the thickness of spacer 24 is selected so that pins 14 do not protrude from spacer 24.

Figure 3B:
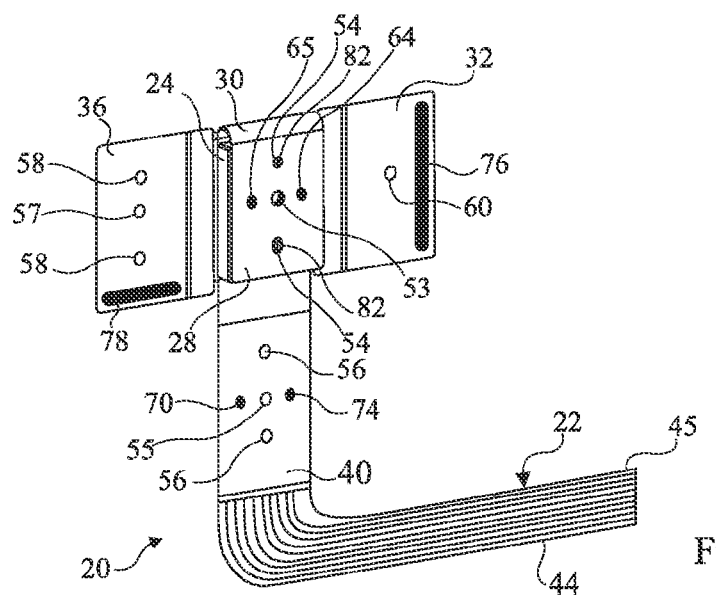

FIG. 3B shows protection device 20 once upper flap 28 has been folded back against spacer 24. Connection portion 30 between central portion 26 and upper flap 28 takes a curved shape to enable the folding of upper flap 28. The thickness of spacer 24, for example of a few millimeters, ensures for the radius of curvature of connection portion 30 not to be too small. Openings 54 of upper flap 28 are arranged so that, after folding back of upper flap 28, pads 82 of spacer 24 penetrate into said openings, which ensures an appropriate positioning of upper flap 28 on spacer 24. Central opening 53 of upper flap 28 is located, after folding back, in prolongation of opening 84 of spacer 24. Protrusions 81 are arranged on spacer 24 to be located, after folding back of upper flap 28, at the level of conductive lands 64, 65.

Figure 3C:
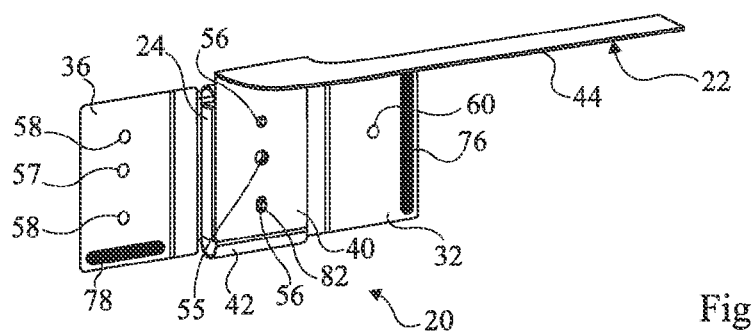

FIG. 3C shows protection device 20 after having folded back lower flap 40 against upper flap 28. Connector portion 42 between lower flap 40 and central portion 26 takes a curved shape to enable the folding back of lower flap 40. Openings 56 of lower flap 40 are arranged so that, after folding back of lower flap 40, pads 82 of spacer 24 penetrate into said openings, which ensures an appropriate positioning of lower flap 40 on upper flap 28. Central opening 55 of lower flap 40 is located, after folding back, in prolongation of opening 84 of spacer 24. After folding back of lower flap 40, external conductive land 70 of lower flap 40 bears against external conductive land 65 of upper flap 28 and eternal conductive land 74 of lower flap 40 bears against external conductive land 64 of upper flap 28. Conductive glue may be previously applied on external conductive lands 64, 65, 70, 74 to improve the electric connection between them. External conductive track 62 is then electrically connected to internal conductive track 68 by the connection of lands 65 and 70 and is electrically connected to internal conductive track 72 by the connection of lands 64 and 74. Protrusions 81 provide a good contact between lands 64 and 70 on the one hand and lands 65 and 74 on the other hand on folding back of lower flap 40. Conductive tracks 68, 62, and 72 are thus series-connected so that a continuous protection track running across flexible printed circuit 22 and connected, at its ends, to connection area 45, is obtained.

Figure 3D:
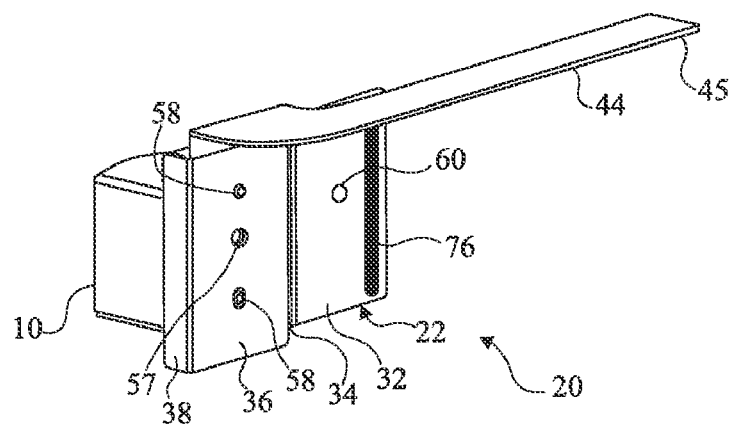

FIG. 3D shows protection device 20 after having folded back lateral flap 36 against lower flap 40. Connector portion 38 is at least partly folded to enable folding back of lateral flap 36. Openings 58 of lateral flap 36 are arranged so that, after folding back of lateral flap 36, pads 82 of spacer 24 penetrate into said openings, which provides an appropriate positioning of lateral flap 36 on lower flap 40. Central opening 57 of lateral flap 36 is located, after folding back, in prolongation of opening 84 of spacer 24. Before folding back of lateral flap 36, glue is applied at the level of widened external conductive portion 78, thus ensuring the fastening of lateral flap 36 to lower flap 40 after folding back.

Figure 3E:
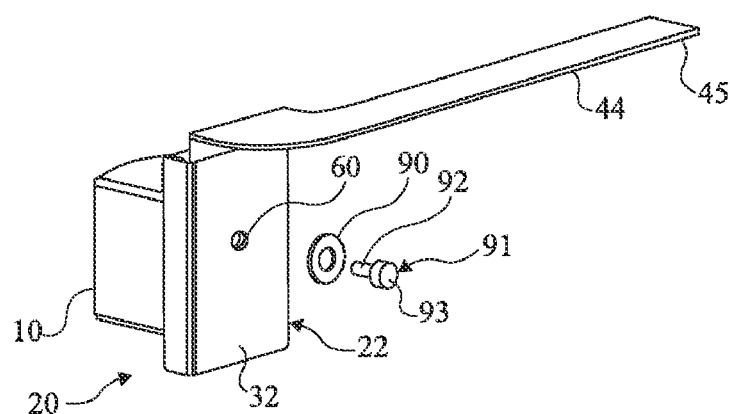

FIG. 3E shows the structure obtained after having folded back lateral flap 32 on lateral flap 36. Connector portion 34 is a least partly folded to enable a folding back of lateral flap 32. Central opening 60 of lateral flap 32 is located, after folding back, in prolongation of opening 84 of spacer 24. Before folding back of lateral flap 32, glue is applied at the level of external conductive portion 76, thus ensuring the fastening of lateral flap 32 to lateral flap 36 after folding back. In FIG. 3E, a washer 90 and a screw 91 have also been shown. Screw 91 comprises a threaded stem 92 and a head 93.

Figure 3F:
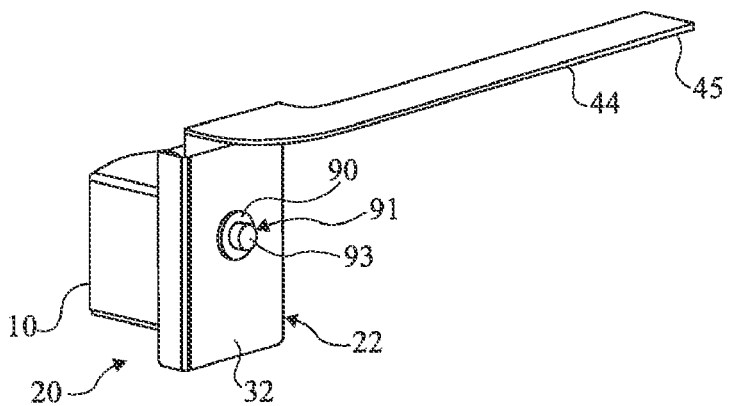

FIG. 3F shows the structure obtained after having screwed rod 92 of screw 91 into threaded opening 84 of spacer 24, washer 90 being interposed between lateral flap 32 and head 93 of screw 91. Head 93 of screw 91 then presses flaps 28, 32, 36, 40 against spacer 24.

Flexible printed circuit 22 can then be connected to the reader motherboard at the level of connection area 45 of connection portion 44. Connection portion 44 being flexible, it can be "deformed" to adapt to the relative position between read head 10 and the motherboard.

According to a variation of the previously-described embodiment, the cohesion of protection device 20 is only ensured by the gluing areas provided at the level of widened external conductive portions 76, 78. Screw 92 may then be omitted. According to another variation, the pressure provided by screw 92 is sufficient to ensure a convenient contact between lands 64, 65 and lands 70, 74. It may then not be necessary to provide conductive glue connecting lands 64, 65 to lands 70, 74.

When flexible printed circuit 22 is connected to the motherboard, external conductive tracks 68, 72 and internal conductive track 62 form a continuous track which is connected to a protection circuit provided at the motherboard level. The protection circuit is capable of detecting an interruption in conductive tracks 62, 68, 72, which may correspond to an attempt of unauthorized access to pins 14 of read head 10. The protection circuit can then control the stopping of the reader and the deleting of all the critical data stored at the motherboard level. As an example, an interruption in conductive track 62 occurs by tearing during an attempt of retrieval of read head 10 from protection device 20. According to another example, if someone removes screw 92 and attempts to open lateral flap 32, this results in a tearing of widened conductive portion 76 and thus in a rupture of conductive track 72. External widened conductive portions 76 and 78 are then used as fuses since they are respectively glued on flaps 36 and 44 and tear in case of an opening of the flaps. An interruption in conductive tracks 62, 68, 72 may also correspond to an attempt to damage, for example, by cutting, flexible printed circuit 22.

In the previously-described embodiment, external conductive track 62 is connected to internal conductive tracks 68, 72 via lands 64, 65, 70 and 74. According to a variation, external conductive track 62 may be connected to tracks 68, 72 by vias crossing the membrane of flexible printed circuit 22. This enables to avoid for external conductive track 62 to extend on connection portion 30 where it is then directly accessible.

Figure 4:
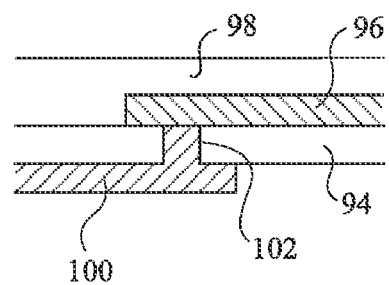
FIG. 4 is a partial simplified view of a variation of the protection device.

FIG. 4 is a simplified cross-section view of a portion of flexible printed circuit 22 comprising a flexible membrane 94, an internal conductive track 96, for example made of copper, formed on membrane 94, an insulating varnish layer 98 covering internal conductive track 96, and an external conductive track 100, for example made of carbon, arranged on the side of membrane 94 opposite to internal conductive track 96. According to the previously-described variation, external conductive track 100 is connected to internal conductive track 96 by a via 102 crossing membrane 94.

Specific embodiments of the present invention have been described. Various alterations and modifications will occur to those skilled in the art. In particular, the number and the shape of the flaps may be adapted to the shape of the read head.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A device for protecting an electronic component comprising at least one pin to be electrically connected to an electronic system, the device comprising at least one flexible printed circuit comprising first and second opposite surfaces, a central portion comprising a through opening into which the pin is to be inserted, and flaps connected to the central portion, the flexible printed circuit being at least partly formed of the stack of two insulating layers and comprising at least a first conductive track between the two insulating layers, for electrically connecting the pin to the electronic system, a second conductive track extending on the first surface, and a third conductive track extending on the second surface, the flaps being capable of being at least partly folded back on one another to encapsulate the pin, the second and third conductive tracks being capable of being electrically connected to each other at least when the flaps are at least partly folded back on one another, whereby the second and third conductive tracks form at least a portion of a protection track to be electrically connected to the electronic system.

2. The device of claim 1, comprising a spacer capable of being arranged between the central portion and the flaps.

3. The device of claim 2, wherein the spacer comprises an additional opening into which the pin is to be inserted.

4. The device of claim 2, wherein the spacer comprises a threaded opening, the device comprising a screw having a threaded rod capable of cooperating with the threaded opening and a head capable of applying said flaps against the spacer.

5. The device of claim 1, wherein the second and third conductive tracks are made of carbon.

6. The device of claim 1, wherein the third conductive track comprises a widened conductive portion at the level of a first flap from among said flaps, the widened conductive portion being capable of being glued to the first surface of a second flap from among said flaps.

7. The device of claim 1, wherein the second conductive track comprises a first conductive land at the level of a first flap from among said flaps and wherein the third conductive track comprises a second conductive land at the level of a second flap from among said flaps, the first and second flaps being capable of being folded back against each other to put the first conductive land in electric contact with the second conductive land.

8. A method for protecting an electronic component comprising at least one pin to be electrically connected to an electronic system, the method comprising the steps of:
  providing a protection device comprising at least one flexible printed circuit comprising first and second opposite surfaces, a central portion comprising a through opening, and flaps connected to the central portion, the flexible printed circuit being at least partly formed of the stack of two insulating layers and comprising at least a first conductive track between the two layers, a second conductive track extending on the first surface, and a third conductive track extending on the second surface;
  inserting the pin into the opening;
  connecting the first conductive track to the pin; and
  at least partly folding back the flaps against one another to encapsulate the pin, the second and third conductive tracks being capable of being electrically connected to each other at least when the flaps are at least partly folded back on one another, whereby the second and third conductive tracks form a protection track to be electrically connected to the electronic system.

9. The method of claim 8, further comprising the steps of arranging a spacer against the central portion and of at least partly folding back the flaps against the spacer.

10. The method of claim 8, wherein the third conductive track comprises a widened conductive portion at the level of a first flap from among said flaps, the method further comprising the step of gluing the widened conductive portion to the first surface of a second flap from among said flaps.

* * * * *